(12) United States Patent
Dersch et al.

(10) Patent No.: US 7,354,684 B2
(45) Date of Patent: Apr. 8, 2008

(54) TEST PATTERN AND METHOD OF EVALUATING THE TRANSFER PROPERTIES OF A TEST PATTERN

(75) Inventors: Uwe Dersch, Dresden (DE); Henning Haffner, Pawling, NY (US)

(73) Assignee: Advanced Mask Technology Center GmbH & Co. KG, Dresden (DE)

( * ) Notice: Subject to any disclaimer, the term of this patent is extended or adjusted under 35 U.S.C. 154(b) by 0 days.

(21) Appl. No.: 11/713,962

(22) Filed: Mar. 5, 2007

(65) Prior Publication Data

US 2007/0207394 A1    Sep. 6, 2007

(30) Foreign Application Priority Data

Mar. 6, 2006    (EP) ................... 06110732

(51) Int. Cl.
*G03F 9/00*    (2006.01)
*G03C 5/00*    (2006.01)

(52) U.S. Cl. ................ 430/30; 382/144; 382/145; 716/19; 716/20; 716/21

(58) Field of Classification Search ............... 430/30; 382/144, 145; 716/19, 20, 21
See application file for complete search history.

(56) References Cited

FOREIGN PATENT DOCUMENTS

JP    2003 262 947    9/2003

WO    WO 2005/059531    6/2005

OTHER PUBLICATIONS

B.D. Bunday et al. "CD-SEM measurement of line edge roughness test patterns for 193 nm lithography", Proceeding of the SPIE, vol. 5041 (Jul. 2003), pp. 127-141.

*Primary Examiner*—Christopher G. Young
(74) *Attorney, Agent, or Firm*—Mayback & Hoffman, P.A.; Gregory L. Mayback; Scott D. Smiley

(57) ABSTRACT

A test pattern or set of patterns, a method of evaluating the transfer properties of the pattern, and a method of determining a parameter of a transfer process (e.g., imaging process) making use of the test pattern is provided. With the test pattern, the impact of line edge roughness on a transferred pattern may be analyzed. For example, the test pattern may be based upon a lines/spaces pattern, wherein periodic structures having a well-defined period and amplitude are adjacent to the lines. A photomask is provided with the test pattern and an image of the pattern is obtained. Edges of the image are determined and, therefrom, a set of edge position data are obtained. Edge position data are fitted to a straight line to determine edge position residuals. An amplitude spectrum is calculated dependent upon spatial frequencies to obtain a amplitude/spatial frequency relationship. A ratio of determined maximum is formed.

17 Claims, 14 Drawing Sheets

1

TEST PATTERN AND METHOD OF EVALUATING THE TRANSFER PROPERTIES OF A TEST PATTERN

CROSS-REFERENCE TO RELATED APPLICATIONS

This applications claims the priority, under 35 U.S.C. § 119, of European Patent Application No. 06 110 732.2, filed Mar. 6, 2006, the prior application is herewith incorporated by reference in its entirety.

BACKGROUND OF THE INVENTION

Field of the Invention

The present invention refers to a test pattern, a set of test patterns, a method of evaluating the transfer properties of a test pattern as well as a method of determining at least one parameter of a transfer process. In particular, the present invention refers to a test pattern that can be used for analyzing the impact of line edge roughness on a transferred pattern.

During the manufacture of a semiconductor device, components of the device usually are formed by patterning layers that are deposited on a semiconductor wafer, in particular, a silicon wafer. The patterning of these layers usually is realized by applying a resist material onto the layer that has to be patterned, and by subsequently exposing predetermined portions of the resist layer that is sensitive to the exposure wavelength. Thereafter, the regions that have been irradiated with the radiation (or not) are developed and the irradiated or radiated portions are subsequently removed. As a consequence, portions of the layer are masked by the generated photoresist pattern during a following process step, such as an etching step or an implantation step. After processing the exposed portions of the underlying layer, the resist mask is removed.

For patterning the resist layer, usually photolithographical masks (photomasks) or reticles are used for transferring a predetermined pattern onto the layer that is to be patterned. For example, a photomask, which can be used for optical lithography, includes a substrate made of a transparent material such as quartz glass, as well as a patterned layer that can be made of an opaque material, for example, a metal such as chromium. Alternatively, the patterned layer can be made of a phase-shifting semitransparent material such as molybdene silioxinitride (MoSiON). In other known photomasks, the quartz substrate itself is patterned to provide a phase-shifting mask. In addition, part of the quartz substrate can be covered with a pattern made of a phase shifting layer. The patterned material results in a modulation of the intensity of the transmitted light.

For Extreme Ultraviolet Lithography (EUV), the mask is made of a substrate and a layer formed thereon, the layer reflecting EUV radiation. This reflecting layer is covered by EUV absorbing layer(s). By patterning the absorber layer(s), an absorber binary mask for EUV is obtained. In case the absorber layer(s) are not deposited on the EUV reflecting layer, an etched multilayer binary mask or EUV phase shifting mask is obtained by patterning the EUV reflecting layer.

During the processing of semiconductor surfaces, the line edge roughness plays an important role. The line edge roughness describes the deviation of edge positions of a pattern from an ideal straight line. In particular, a photomask exhibits a specific line edge roughness. Moreover, during the processing steps starting from a photomask and a blanket wafer to a patterned wafer surface, further line edge roughness is introduced. Accordingly, it would be desirable to investigate the influence of the line edge roughness of the photomask and of specific process parameters on the line edge roughness of the patterned wafer surface.

Furthermore, it is assumed, that with shrinking feature sizes, the influence of the line edge roughness on the device performance is greatly enhanced. For example, when further reducing the gate length, the line edge roughness of the gate electrode is expected to be the dominant factor determining the transistor performance. Accordingly, the line edge roughness endangers the further shrinking of the feature sizes. Hence, a tool for analyzing the manufacturing processes in terms of the line edge roughness is greatly desirable.

SUMMARY OF THE INVENTION

It is accordingly an object of the invention to provide a test pattern, a set of test patterns, a method of evaluating the transfer properties of a test pattern, and a method of determining at least one parameter of a transfer process that overcome the hereinafore-mentioned disadvantages of the heretofore-known devices of this general type and that improve upon prior art devices and methods.

With the foregoing and other objects in view, there is provided, in accordance with the invention, a test pattern, which forms part of a reticle, including lines having two lateral sides extending along a reference direction, the lines having a line width w, and periodic structures that are directly adjacent and connected with the lines. The structures project from the lines, each of the structures having a maximum at which a distance from an outer edge of the structure to the line is largest and an amplitude A that is the difference between the maximum and a minimum distance between the outer edge of the structure and the line. The difference is measured perpendicularly with respect to the reference direction. The structures are disposed at a fixed period $1/f$, where the amplitude A of all the structures are substantially equal or identical, and there are spaces that are adjacent to the lines including the structures so that, on either side of each line including the structures, there are disposed two spaces, respectively, and vice-versa. The spaces have a spaces width s measured perpendicularly with respect to the reference direction, the spaces width s corresponding to the distance between two adjacent lines. An effective line width CD of the test pattern is defined such that:

$$CD \times 1 = B,$$

where: 1 corresponds to the length of the line in the reference direction and B corresponds to the area of a specific line including the periodic structures. The lines and the periodic structures are made of a mask forming material. In particular, the spaces can be made of a transparent material or a material that will not influence the transmitted light.

With the objects of the invention in view, there is also provided a method of evaluating the transfer properties of a test pattern including the steps of providing a photomask including a test pattern as defined above, transferring the test pattern, thereby obtaining an image of the test pattern, determining the edges of the image of the test pattern, thereby obtaining a set of edge position data, fitting the edge position data to a straight line and determining the edge position residuals, and calculating the amplitude spectrum in dependence of spatial frequencies, thereby obtaining the relationship A(fx, image) representing the amplitude in dependence of the spatial frequency.

For example, the image of the test pattern can be obtained by recording the aerial image of the photomask or by taking an image, for example, a scanning electron microscope (SEM) image of the transferred pattern. In addition, the image of the test pattern can be an SEM image of the pattern formed in the photomask. Alternatively, the image can be taken by any other suitable method such as scanning tunneling microscope (STM), atomic force microscope (AFM), or an interferometer method such as adaptive interferometric metrology system (AIMS). The pattern can be transferred by a common lithographic process including an exposure step and a development step. Furthermore, the pattern can be transferred by an etching step or any other suitable processing step.

With the objects of the invention in view, there is also provided a method according to the present invention of determining at least one parameter of a transfer process including the steps of providing a photomask including a plurality of test patterns as defined above, each of the plurality of test patterns having a different fixed period 1/fx selected from a predetermined range of fx, performing the transfer process using a variety of process parameters, thereby obtaining a set of transferred patterns corresponding to each of the variety of process parameters, providing a set of images of the set of transferred patterns, evaluating the set of images of the transferred patterns by performing the steps determining the edges of the image of the transferred pattern, thereby obtaining a set of edge position data; fitting the edge position data to a straight line and determining the edge position residuals, and calculating the amplitude spectrum in dependence of spatial frequencies, thereby obtaining the relationship A(f, image) representing the amplitude in dependence of the spatial frequency, determining a maximum A(fx,image) of the relationship A(f,image); determining a maximum A(fx,photomask) of a reference amplitude spectrum, and forming a ratio of the maximum A(fx,image) of the image of the test pattern and the maximum A(fx, photomask), selecting the process parameter so that the ratio of A(fx,photomask)/A(fx,image) is minimal in the predetermined range of fx.

Examples of the transfer process include the exposure process, the development step and an etching step.

Accordingly, a test pattern according to the present invention includes a lines/spaces pattern, wherein the lines additionally include periodic structures so as to have a predetermined roughness. Hence, the behavior of specific processes on structures having a predetermined roughness can be analyzed. The present invention further provides a method of analyzing and characterizing the transfer of line edge/width roughness and its impact through the whole process chain from making the photomask, transferring it into the wafer resist and the subsequent layer structuring on the wafer to the final impact on the electrical performance of the resulting functional structures on the wafer such as transistors of a microprocessor or memory chip. The method includes a multi-step process of measuring the actual line edge/width roughness of a variety of programmed line edge/width roughnesses on a test design, at the end of several production processes of the photomask as well as of the wafer. The data are analyzed and a line edge/width roughness transfer function is derived. Additionally, the programmed line edge/width roughnesses are brought into relation to the process windows of critical process steps as well as the electrical behavior of the resulting functional structures on the wafer. Moreover, criteria of limits of maximum acceptable line edge/width roughnesses are derived. These can be used for improving the mask making process conditions as well as the mask specifications.

In accordance with another mode of the invention, the periodic structures are formed on either of the lateral sides of the lines with an amplitude and a period of the structures of both of the lateral sides being substantially equal.

In accordance with a further mode of the invention, a maxima of the periodic structure is formed on a first of the lateral sides at the same height as corresponding maxima of a second of the lateral sides, the height being measured along the reference direction.

In accordance with an added mode of the invention, a maxima of the periodic structures is formed on a first of the lateral sides at a position shifted by half a period with respect to a height of corresponding maxima of the periodic structures on a second of the lateral sides, the height being measured along the reference direction.

In accordance with an additional mode of the invention, the line width is approximately equal to the spaces width.

In accordance with yet another mode of the invention, the line width is larger than the spaces width.

In accordance with yet a further mode of the invention, the line width is smaller than the spaces width.

In accordance with yet an added mode of the invention, the periodic structures have an amplitude A in a range of between approximately 20 nm and approximately 220 nm.

In accordance with yet an additional mode of the invention, the periodic structures have an amplitude A in a range of between approximately 80 nm and approximately 150 nm.

In accordance with again another mode of the invention, the periodic structures have a fixed period 1/f less than approximately 4000 nm.

In accordance with again a further mode of the invention, the lines and the periodic structures define an effective line width less than approximately 360 nm.

In accordance with again an added mode of the invention, the maximum A(fx,photomask) determining step is carried out by obtaining the maximum A(fx,photomask) of the reference amplitude spectrum by evaluating design data of the photomask.

In accordance with a concomitant mode of the invention, the maximum A(fx,photomask) determining step is carried out by obtaining the maximum A(fx,photomask) of the reference amplitude spectrum by: taking an image of the photomask; determining edges of the image of the photomask and obtaining therefrom a set of photomask edge position data; fitting the photomask edge position data to a straight line and determining photomask edge position residuals; calculating the amplitude spectrum dependent upon spatial frequencies to, thereby, obtain a relationship A(f,photomask) representing the amplitude dependent upon the spatial frequency; and determining a maximum A(fx, photomask) of the relationship A(f,photomask).

Other features that are considered as characteristic for the invention are set forth in the appended claims.

Although the invention is illustrated and described herein as embodied in a test pattern, a set of test patterns, a method of evaluating the transfer properties of a test pattern, and a method of determining at least one parameter of a transfer process, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

In the following, the invention will be described in more detail by exemplary embodiments and the corresponding figures. By schematic illustrations that are not true to scale, the figures show different exemplary embodiments of the invention.

In the following, the present invention will be described in greater detail with reference to the accompanying drawings.

DESCRIPTION OF THE PREFERRED EMBODIMENTS

Referring now to the figures of the drawings in detail and first, particularly to FIGS. 1A to 1D thereof, there are shown various elements of a test pattern according to the present invention.

Figure 1A:
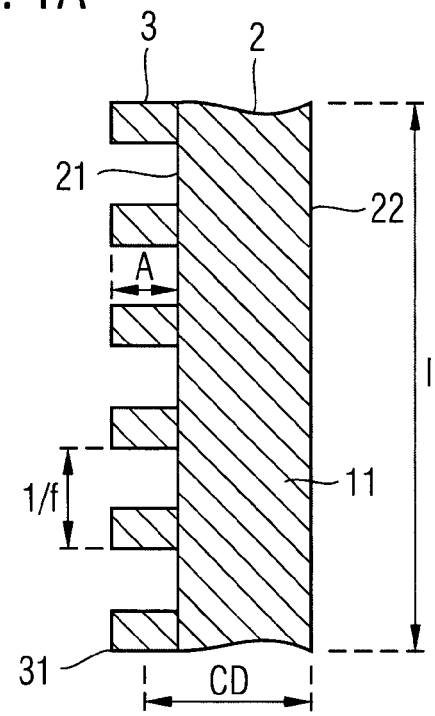
FIGS. 1A to 1D are fragmentary, enlarged, cross-sectional views of exemplary elements forming part of test patterns according to the invention.

In FIG. 1A an element 11 of a test pattern includes a line 2 having two lateral sides 21, 22 extending in a reference direction 23 as is indicated by the arrow 23. In addition, the element of the test pattern includes periodic structures 3. Each of the periodic structures shown in FIG. 1A has the same shape, in particular, the same width and height. Each of the periodic structures shown in FIG. 1A is disposed at the same distance 1/f wherein 1/f represents the spatial period of the periodic structures. As is shown in FIG. 1A, the periodic structures 3 are made of rectangles, wherein the width can be different from the height of the structures. The period corresponds to the distance between two neighboring structures. Each of the structures has an amplitude A that is the difference between the maximum 31 and the adjacent lateral side 21 of the line. The periodic structures are directly adjacent to the lines so that no boundary is to be seen between the structures 3 and the lines 2.

Figure 1B:
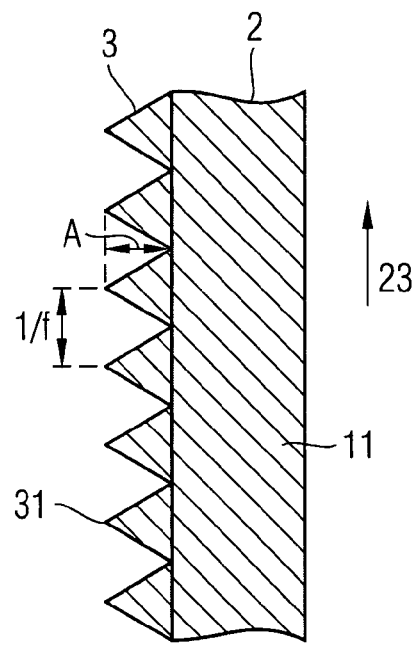

In the test pattern shown in FIG. 1B, the structures are formed as triangles, wherein the amplitude A and the distance between neighboring maxima 1/f can be arbitrarily chosen.

Figure 1C:
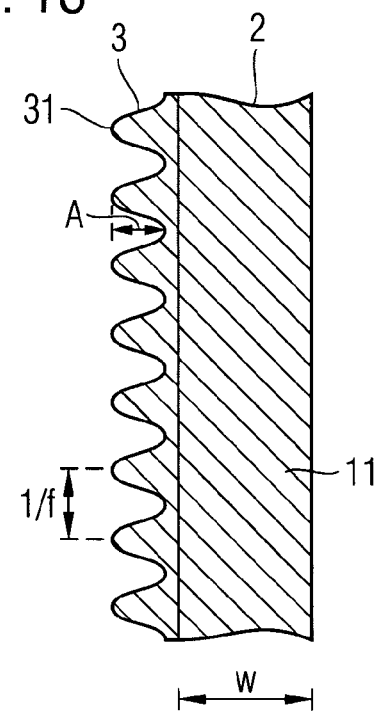

In FIG. 1C, the periodic structures have a corrugated shape. In particular, the valley of the single waves can coincide with the lateral side 21 or can be at a distance therefrom.

Figure 1D:
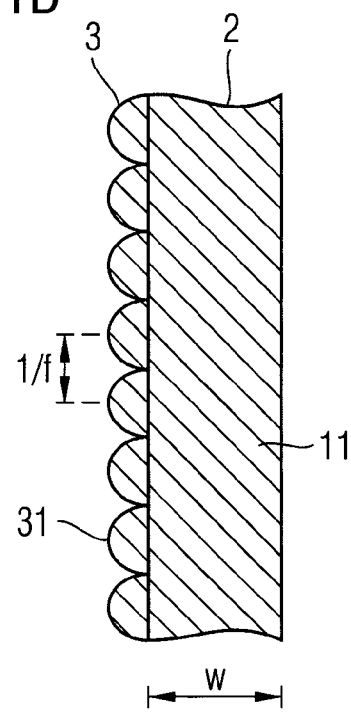

As is shown in FIG. 1D, the periodic structures 3 can have the shape of part of a circle, for example, a semicircle.

The periodic structures can have any arbitrary shape and the above shapes are only given as examples. Each of the lines has a line width w, corresponding to the distance between the two lateral sides 21, 22, measured perpendicularly with respect to the reference direction 23. An effective line width CD of the test pattern is defined such that CD×l=B, where l corresponds to the length of the line in the reference direction 23 and B corresponds to the area of a certain line including the periodic structures.

For example, with respect to the pattern shown in FIG. 1A, if the width of each of the periodic structures is equal to ½f, the width being measured in the reference direction 23, the effective line width CD is equal to w+A/2 in a case in which the periodic structures are disposed on one side of the lines only, whereas the effective line width CD is equal to w+A in a case in which the periodic structures are disposed on either sides of the lines.

The lines and the periodic structures are made of a mask forming material. By way of example, as has been described above, the lines and the periodic structures can be made of an opaque material, for example, a metal such as chromium. In addition, the lines and the periodic structures can be made of a phase shifting semitransparent material such as Molybdenesilioxinitrid (MoSiON). Alternatively, in case the mask to be formed is an EUV mask, the lines and the periodic structures can be made of an EUV absorbing layer or a layer reflecting EUV radiation. As is to be clearly understood, the substrate of the reticle itself can be patterned to form the lines and the periodic structures. The choice of the material of which the lines and the periodic structures are made depends on the lithographic processes and the technology in which the test pattern is to be used. As has been described above, the boundaries between the periodic structures 3 and the lines are not visible, the lines 2 and the periodic structures being directly adjacent or contiguous to each other.

The spatial periods 1/f of each of the test patterns can be in a range of 80 nm to 4000 nm. Nevertheless, for implementing the present invention, also a smaller or larger range can be taken. In addition, also the upper boundary can be larger, and the lower boundary can be smaller. Differently speaking, the distance between neighboring peaks or the distance between neighboring maxima of these periodic structures measured in the reference direction can be 80 nm to 4000 nm. In addition, the amplitude of each of the periodic structures corresponding to the distance between the maximum and the adjacent lateral side 21, 22 of the line can be in a range of 80 nm to 220 nm. In particular, it is important that the effective line width CD of the line including the periodic structures is greater than the amplitude of the periodic structure. In particular, if the spatial period is smaller than 80 nm, the processing of the transferred pattern becomes more difficult. In addition, if the amplitude is greater than 220 nm, no additional knowledge is obtained upon evaluating the image of the transferred pattern. In particular, as well spatial periods, which are smaller than 80 nm can be used, depending on the quality of the mask processing method, for example, also a spatial period of 40 nm can be used.

FIG. 2 shows elements 11 of test patterns, in which the periodic structures are disposed differently.

Figure 2A:
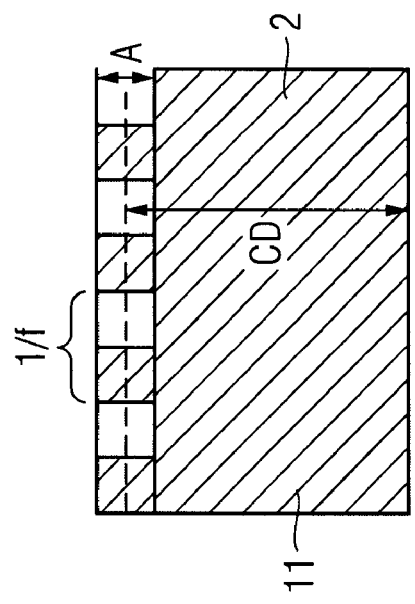
FIGS. 2A to 2D are fragmentary, enlarged, cross-sectional views of different exemplary elements forming part of test patterns embodying the invention.
Figure 2B:
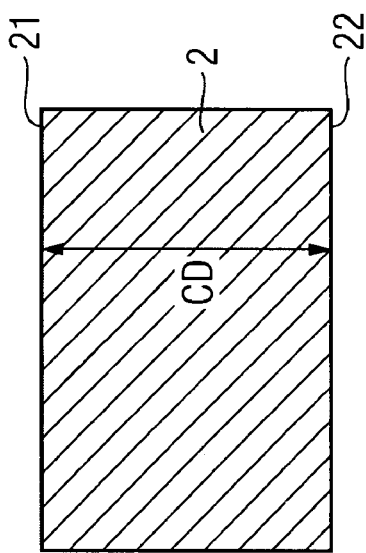

FIG. 2A shows lines 2 without any additional structures projecting from the lines. This pattern is referred to as a reference pattern or a plain lines/spaces pattern. In the test pattern shown in FIG. 2B, the periodic structures are formed on only one lateral side of the line. This pattern is referred to as a single-sided pattern.

Figure 2C:
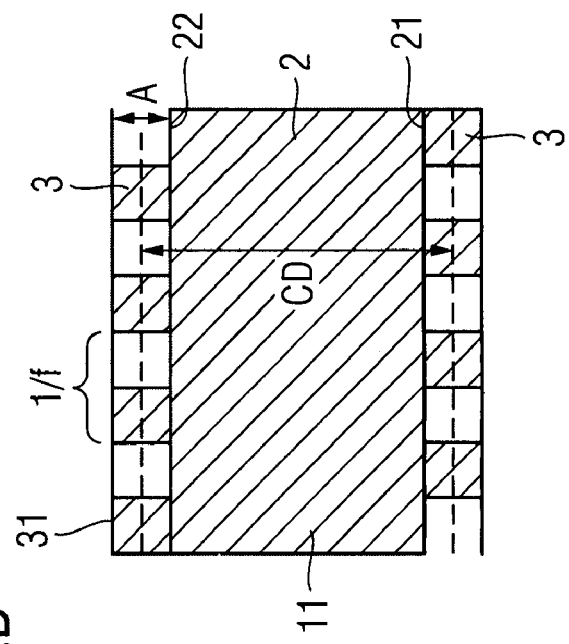

In the pattern shown in FIG. 2C, the periodic structures are disposed on either lateral sides 21, 22 of the line 2. In addition, the maxima 31 of the periodic structures 3 of the first side of the line 21 are disposed on the same height as the maxima 31 of the second side 22, wherein the height is measured along the reference direction 23. This pattern is referred to as an anti-correlated feature or an anti-correlated pattern.

Figure 2D:
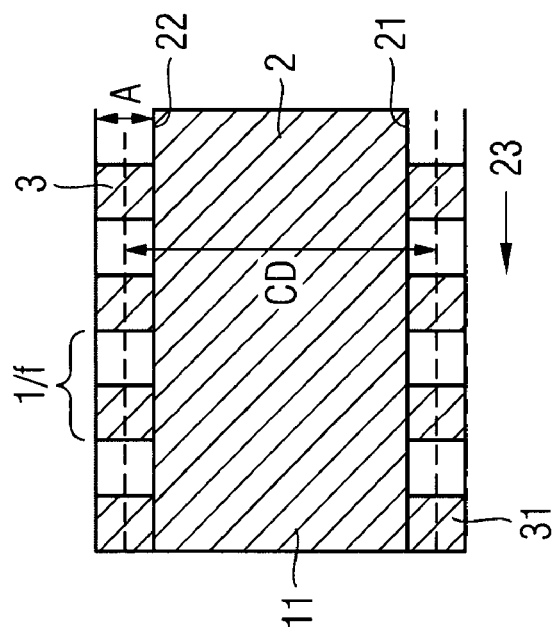

In the pattern shown in FIG. 2D, the periodic structures are, as well, disposed on either lateral sides 21, 22 of the line 2. As can be seen, the maxima 31 of the structures 3 are disposed on the first side 21 of the line at a position that is shifted by half of the period with respect to the height of the maxima 31 of the second side 22 wherein the height is measured along the reference direction 23. Differently speaking, when cutting perpendicularly with respect to the referenced direction 23 in FIG. 2C, the peak on the first side 21 coincides with the peak on the second side 22. In contrast, when cutting perpendicularly to a reference direction 23 in the pattern shown in FIG. 2D, a peak of the structures disposed on the first lateral side 21 coincides with a valley of the structures disposed on the second lateral side and vice-versa. The pattern shown in FIG. 2D is referred to as a fully correlated pattern.

Figure 3:
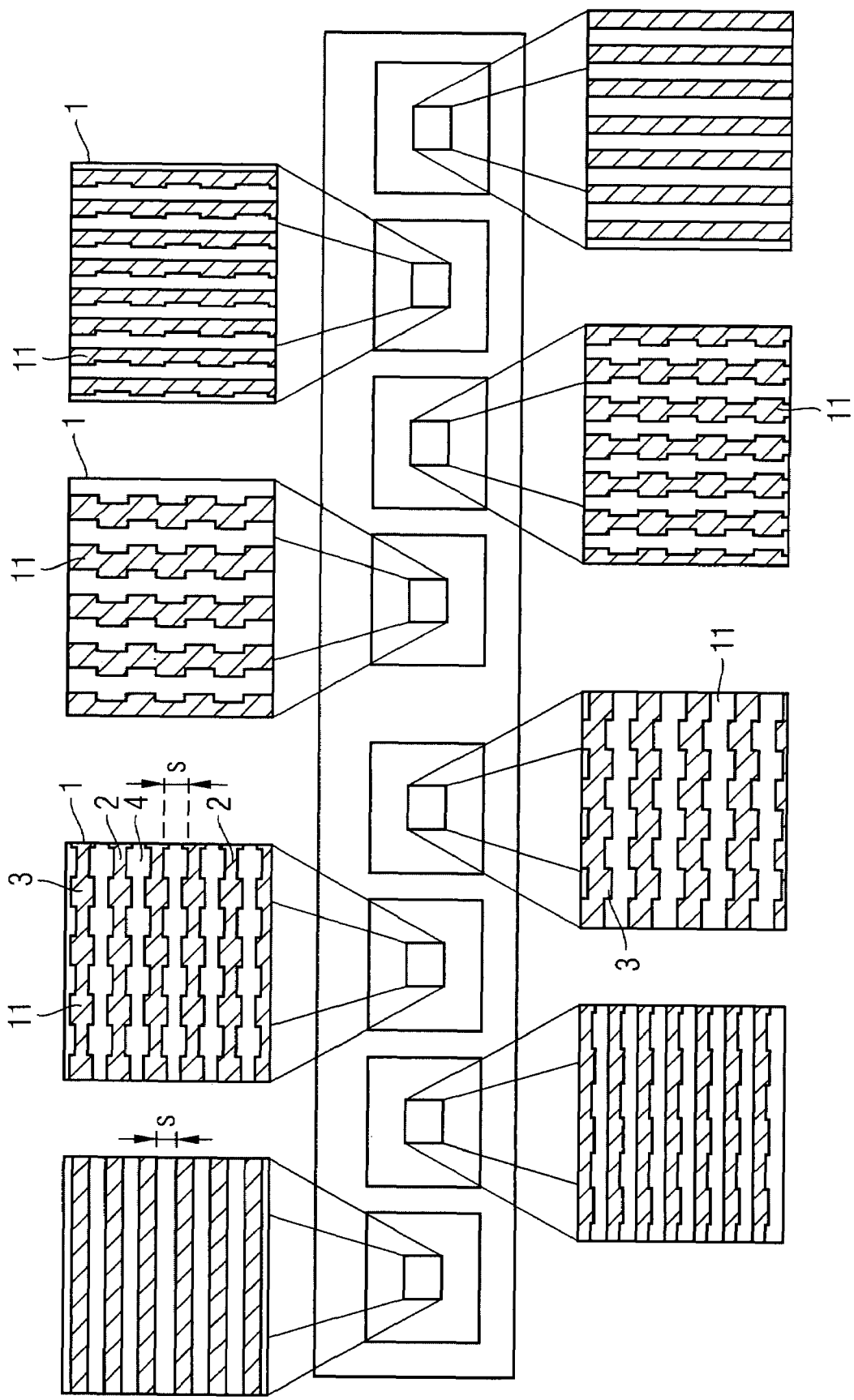
FIG. 3 is a fragmentary, enlarged plan view of a set of test patterns according to an exemplary embodiment according to the invention.

FIG. 3 shows a set of test patterns according to the present invention. As can be seen, the test pattern shown in FIG. 3 includes first and second subsets of test patterns, wherein the reference direction of the second subset is rotated by 90° with respect to the reference direction of the first subset. The rotation of the second subset by 90° is advantageous because, thereby, influences of the orientation direction of a pattern can be investigated. As is to be known, in particular, the lithographic processes can greatly depend on the direction of the lines/spaces pattern. This influence can be investigated by rotating the test patterns.

The set of lines/spaces test patterns shown in FIG. 3 include a reference pattern (here, a plain lines/spaces pattern), a single sided pattern, an anti-correlated pattern, and a fully correlated pattern.

As can be seen from FIG. 3, spaces 4 are disposed between the lines including the periodic structures. In particular, the spaces 4 have a spaces width s that corresponds to the distance between two adjacent lines 21, 22, measured perpendicularly with respect to the reference direction 23. In particular, in the set of test patterns shown in FIG. 3, the spaces width s is approximately equal to the effective line width CD of each of the test patterns. In each of the single test patterns forming one subset of test patterns, the amplitude, the period as well as the effective line width CD of the test pattern is equal to each other. The set or subset of test patterns wherein the effective line width CD is approximately equal to the spaces width s of the spaces 4 is referred to as a dense test pattern. In particular, in the dense test pattern the following relation holds:

$$0.5 \times CD \leq s \leq 2 \times CD.$$

Figure 4:
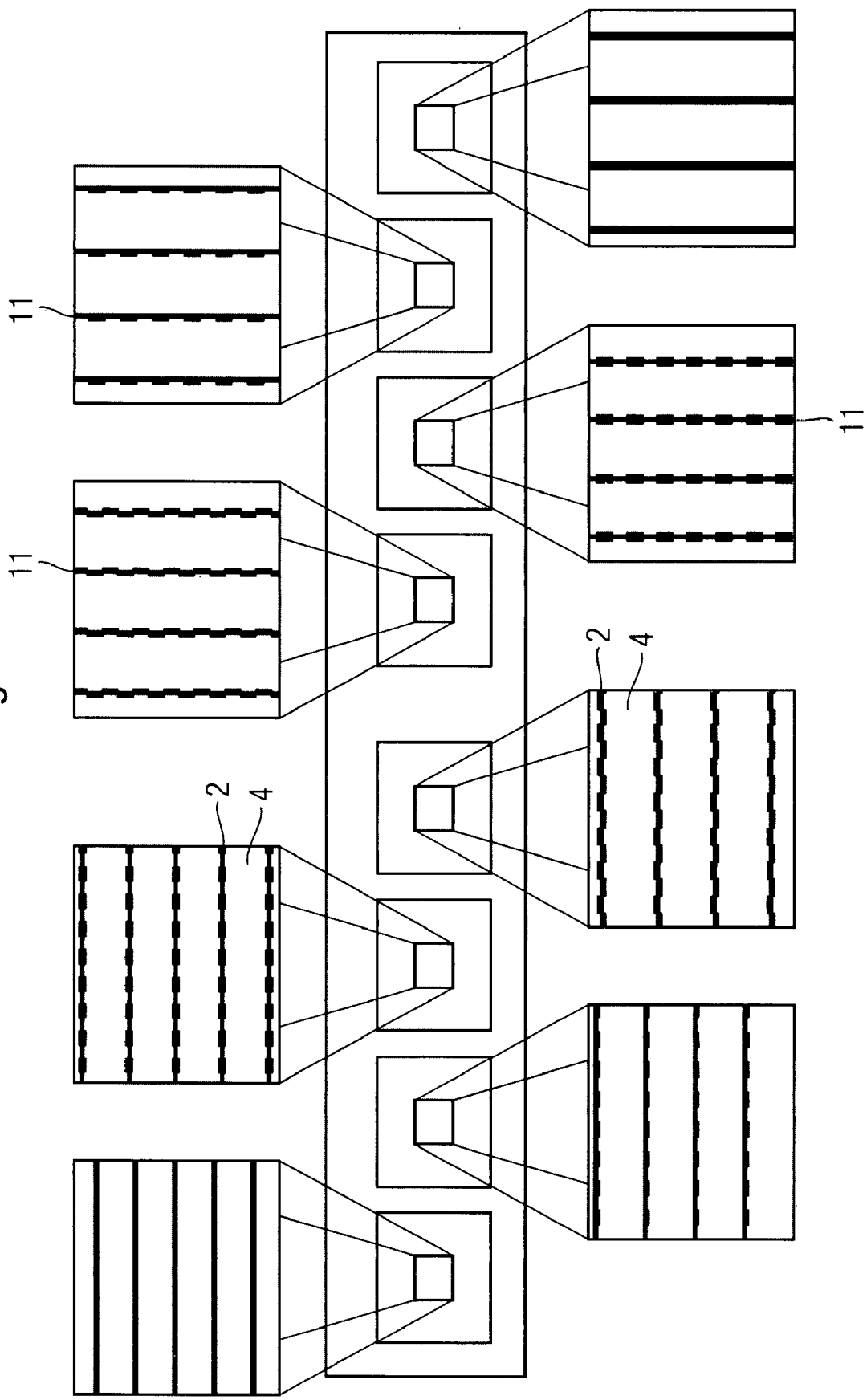
FIG. 4 is a fragmentary, enlarged plan view of a set of test patterns according to a further exemplary embodiment according to the invention.

FIG. 4 shows a set of test patterns including two subsets of test patterns, the two subsets being rotated by 90° with respect to one another. The composition of each of the subsets is equal to the one illustrated in FIG. 3. In particular, FIG. 4 includes a single-sided pattern, an anti-correlated pattern, a fully correlated pattern, and a reference pattern (plain lines/spaces pattern). In the set of test patterns shown in FIG. 4, the spaces width s is much smaller than the effective line width CD, i.e., s<0.5×CD. Accordingly, the test pattern shown in FIG. 4 is referred to as an "iso(lated) space" pattern.

Figure 5:
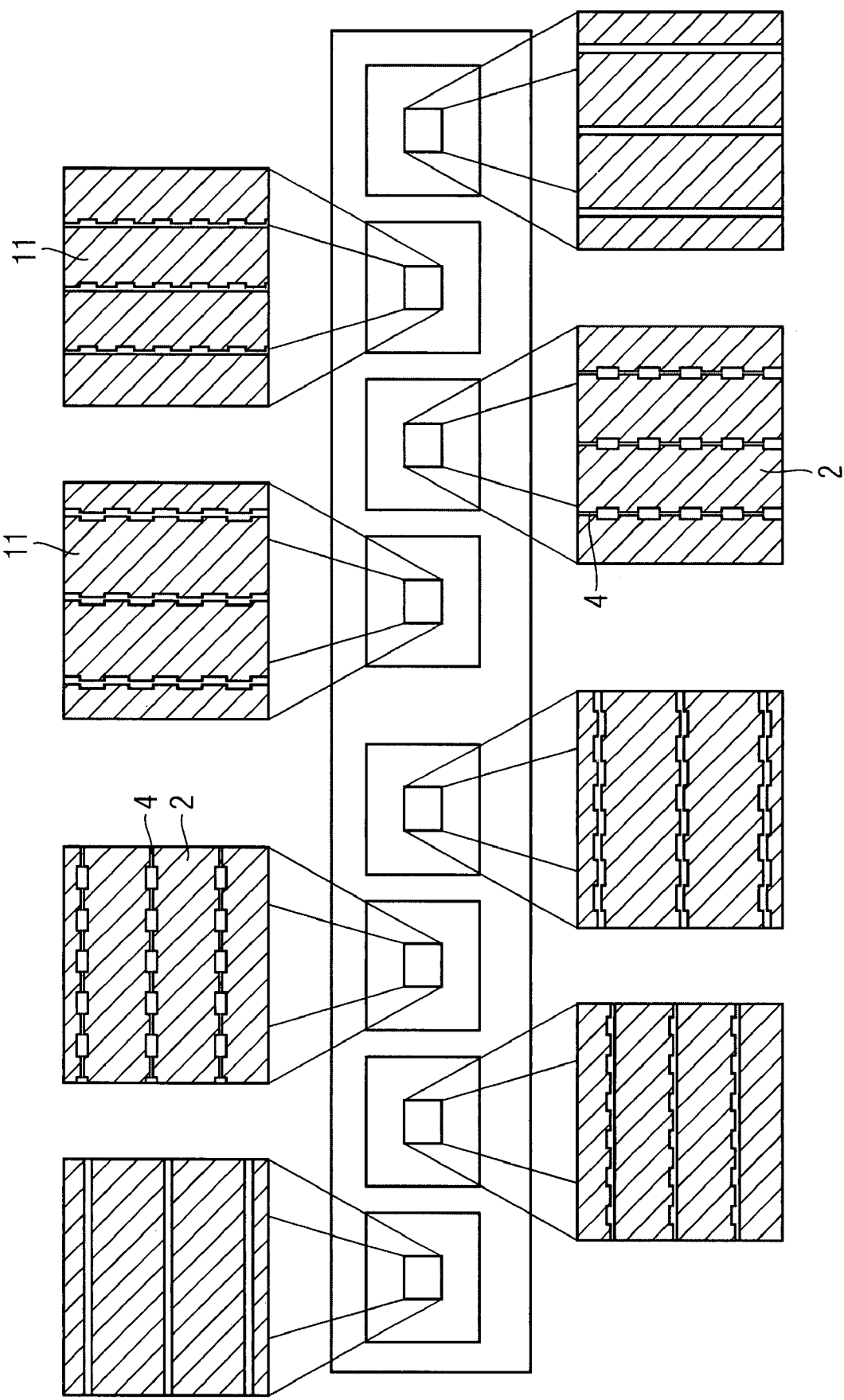
FIG. 5 is a fragmentary, enlarged plan view of a set of test patterns according to another exemplary embodiment of the present invention.

FIG. 5 shows a further exemplary set of test patterns. The set shown in FIG. 5 likewise includes two subsets, which are rotated by 90° with respect to each other. Each of the subsets includes a single sided pattern, a fully correlated pattern, an anti-correlated pattern, and a reference pattern (a plain lines/spaces pattern). In each of the test patterns shown in FIG. 5, the spaces width s is much larger than the effective line width CD, i.e. s>2×CD. Accordingly, the pattern shown in FIG. 5 is referred to as an "iso(lated) line" pattern.

Figure 6:
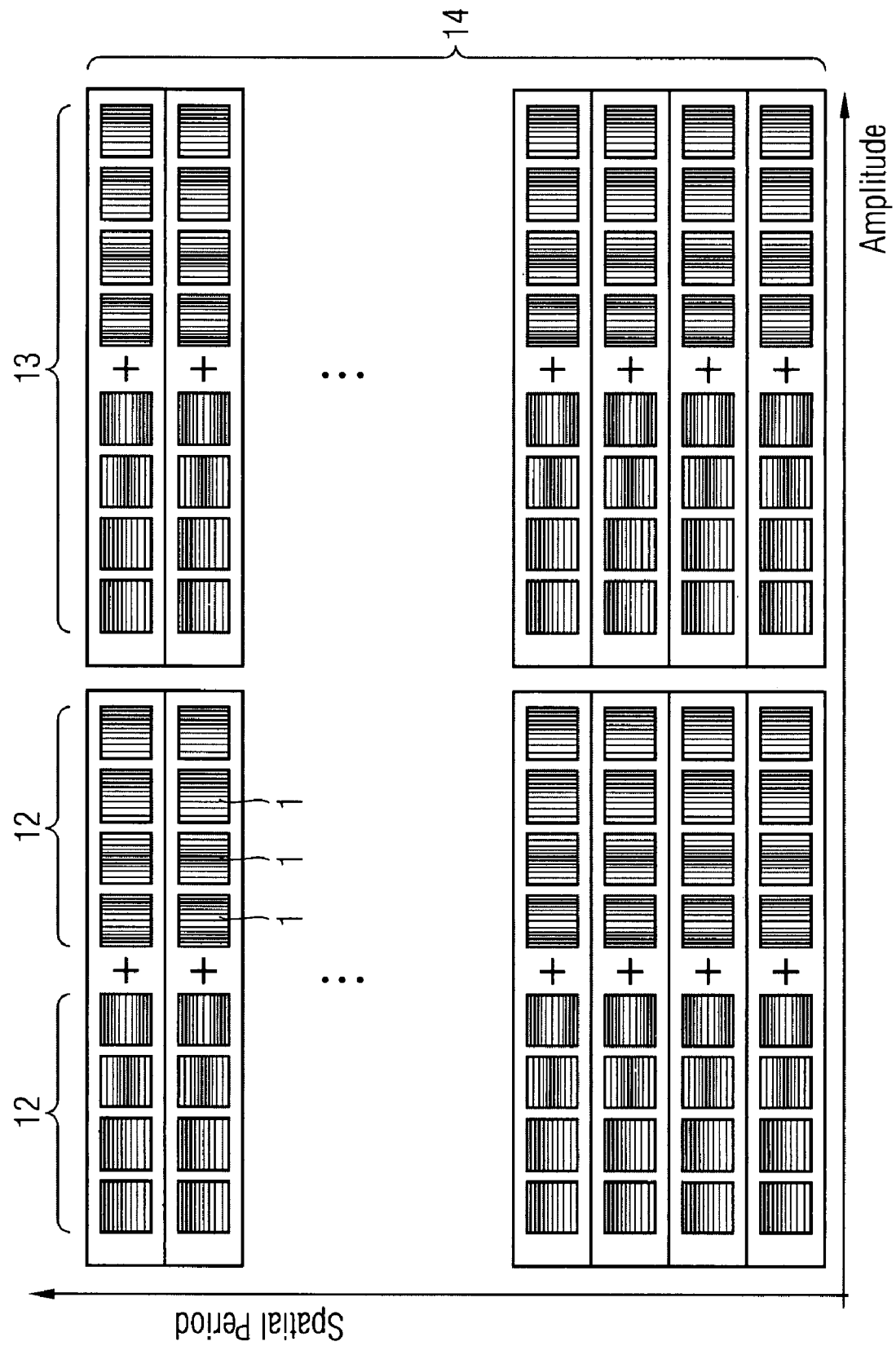
FIG. 6 is a diagrammatic plan view of a portion of an array of test patterns according to still another embodiment of the present invention.

FIG. 6 shows an exemplary array 14 of test patterns for a fixed effective line width CD. As is indicated by the arrows, the configuration includes a variety of sets 13 of test patterns, each of the sets 13 comprising two subsets 12 of test patterns, which are rotated by 90° with respect to each other. Each of the subsets includes, for example, a reference pattern (a plain lines/spaces pattern), a single sided test pattern, a fully correlated pattern, and an anti-correlated test pattern. Nevertheless, as is to be understood, each of the subsets may comprise less or even more test patterns. The configuration shown in FIG. 6 shows a plurality of these sets of test patterns wherein the amplitude is varied, for example from 80 to 220 nm, for example, by steps of 20 nm, and the spatial period is varied from 80 nm to any arbitrary value, for example, 4000 nm. In particular, the step widths of the spatial period can vary to implement an exemplary spatial period 1/f of 80 nm, 90 nm, 100 nm, 120 nm, 140 nm, 160 nm, 200 nm, 250 nm, 300 nm, 400 nm, 500 nm, 600 nm, 700 nm, 800 nm, 900 nm, 1000 nm, 1500 nm, 2000 nm, 2500 nm, 3000 nm, 4000 nm.

Figure 7:
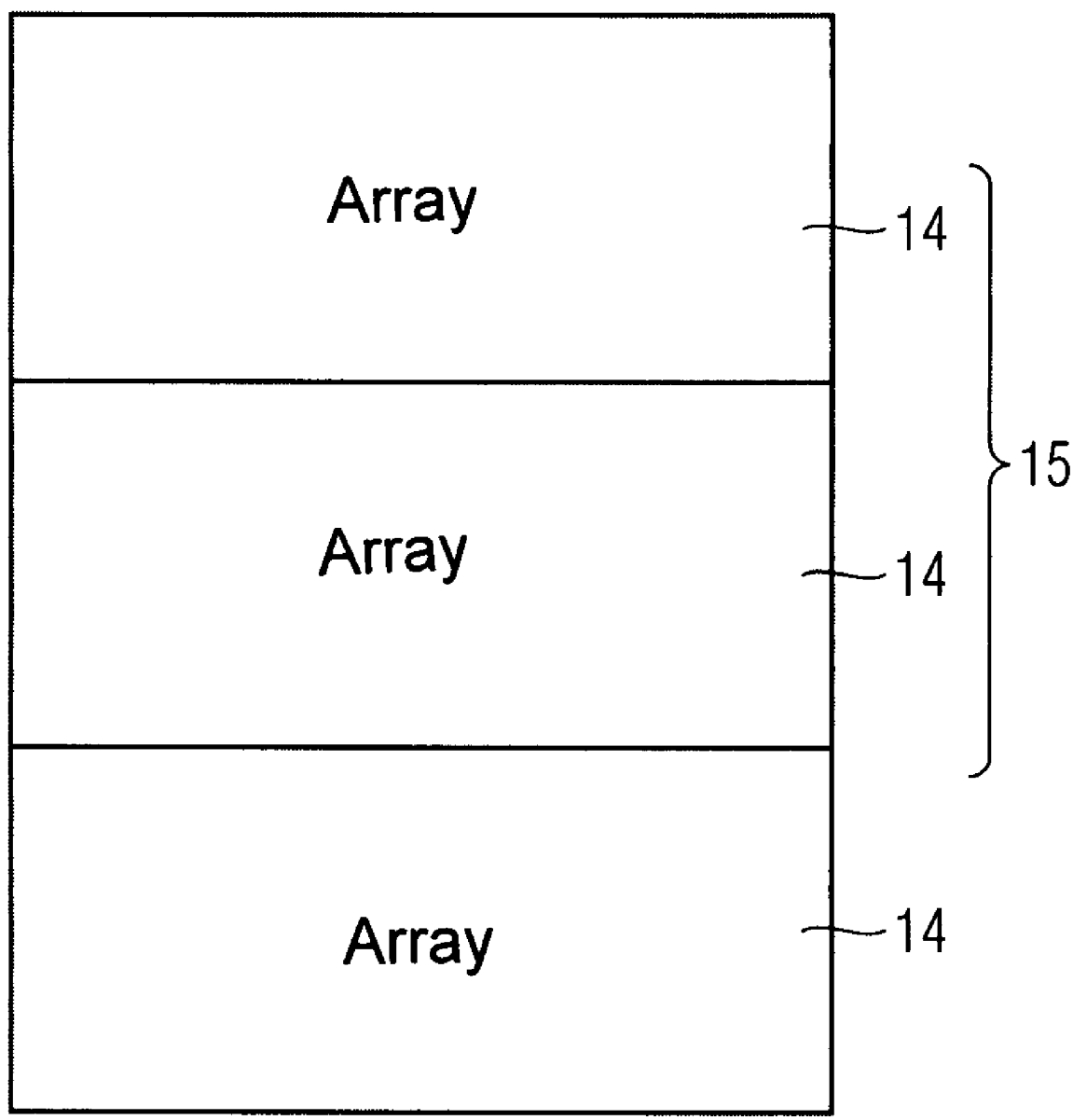
FIG. 7 is a block diagram of an exemplary group of test patterns according to the invention.

FIG. 7 shows an exemplary group 15 of test patterns for a fixed effective line width CD. In particular, the group 15 shown in FIG. 7 includes three arrays 14 of test patterns as illustrated in FIG. 6, wherein the first array 14 is an array of dense test patterns, the second array 14 is an array of iso-line test patterns, and the third array is an array of iso-space test patterns.

Figure 8B:
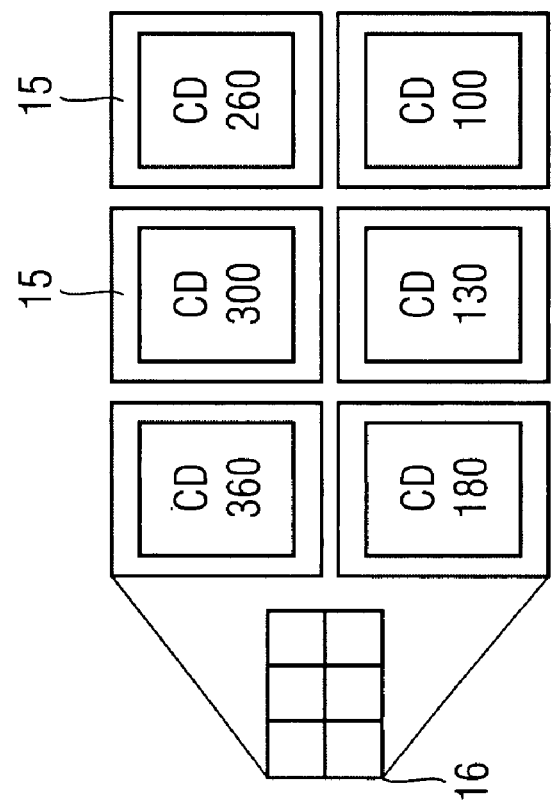
FIG. 8B is a diagrammatic, fragmentary, enlarged, plan view of a test pattern of FIG. 8A.
Figure 8A:
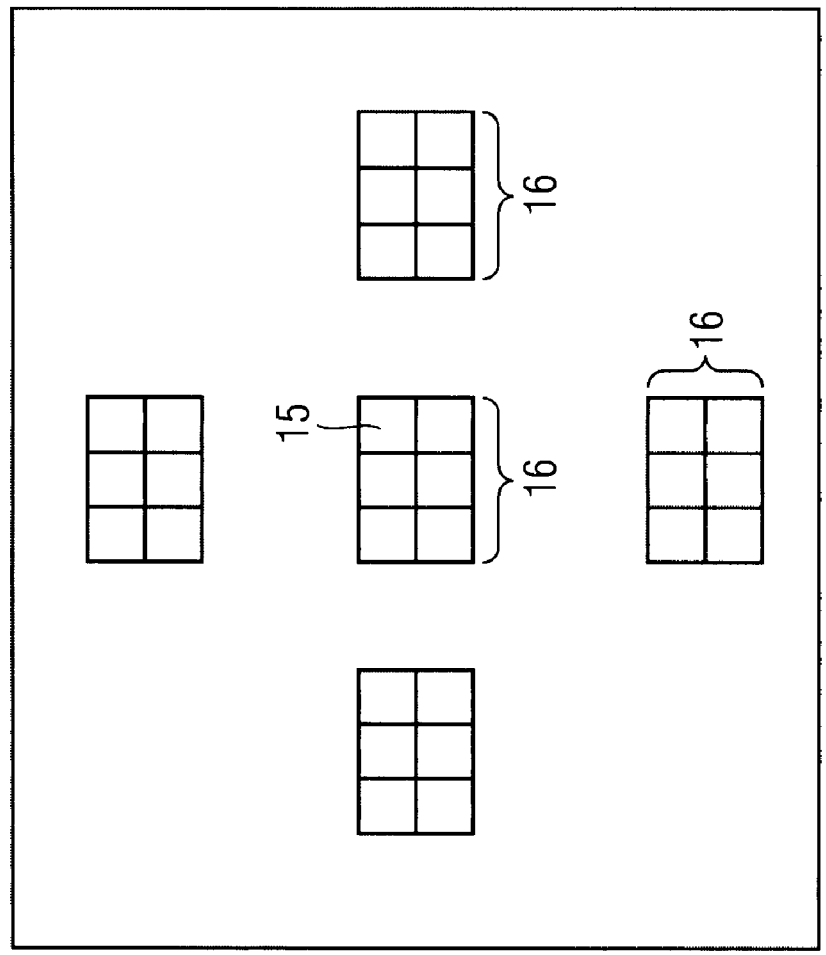
FIG. 8A is a diagrammatic, fragmentary, plan view of an exemplary photomask incorporating five exemplary arrangements of test patterns according to the present invention.

A photomask can, for example, include one or more, in particular, five, configurations 16 of test patterns, wherein each configuration 16 includes different groups 15 of test patterns, the test patterns of each different group having a different effective line width CD. For example, the effective line width CD can vary from 100 nm to 360 nm, and, as is shown in FIG. 8B, the configuration 16 includes six groups 15 of test patterns. As is further shown in FIG. 8A, on a photomask, for example, five configurations 16 of test patterns can be disposed. In particular, these configurations 16 can be disposed to form a cross.

According to a further embodiment, the present invention refers to a method of evaluating the transfer properties of a test pattern, wherein a test pattern forming part of a photomask is transferred, whereby an image of the test pattern is obtained. In particular, the image can be obtained by forming an aerial image using the photomask including the set of test patterns as described above. The transferred pattern can, as well, be formed as a resist pattern using an exposure tool and the standard litho process using a photomask including the set of test patterns as described above. In addition, the transferred pattern can be the pattern that is obtained after a further processing step, for example, after an etching step.

FIG. 9 illustrates the steps after which an image of the transferred pattern can be taken.

Figure 9A:
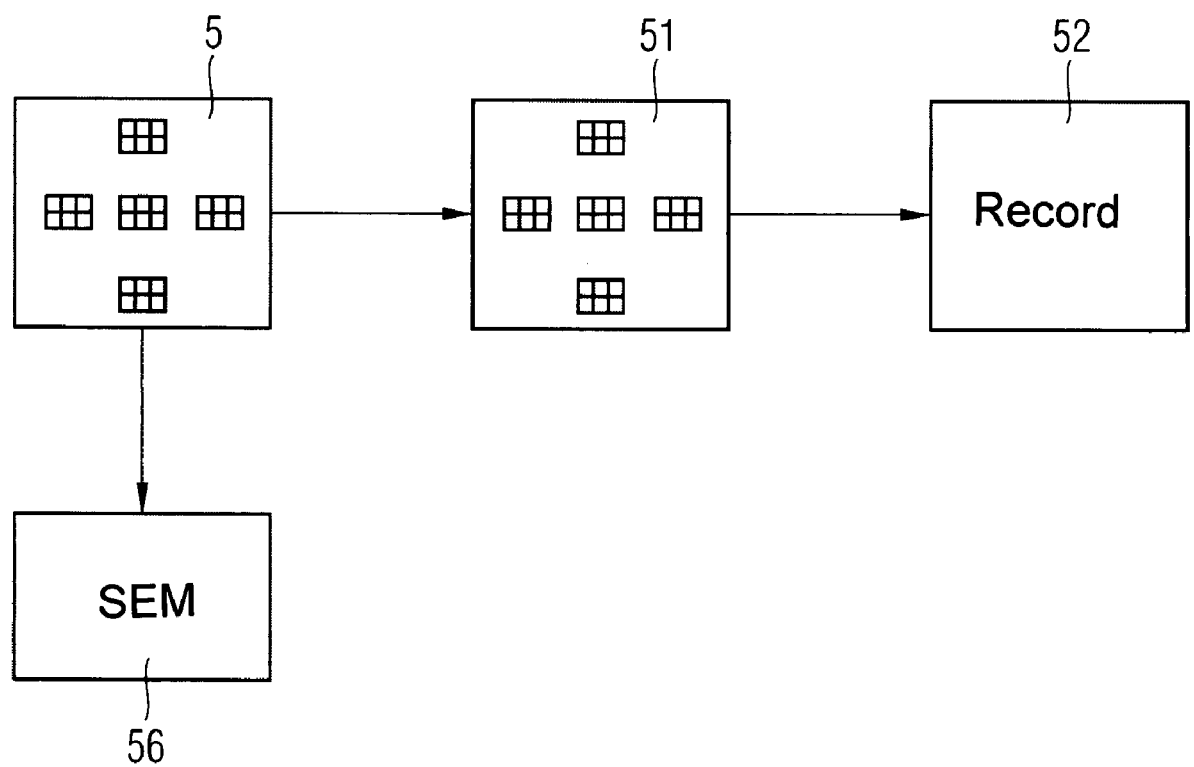
FIG. 9A is a block diagram illustrating steps of obtaining a record of an aerial image of a photomask according to the invention.

For example, as is shown in FIG. 9A, a photomask 5 can be imaged, whereby an aerial image 51 is generated. The aerial image 51 is recorded, thus obtaining a record 52 of the aerial image. This record of the aerial image 52 can be evaluated using the method of the present invention as will be described below. In addition, a SEM 56 image of the photomask can be taken and evaluated using the method of the present invention as will be described below.

Figure 9B:
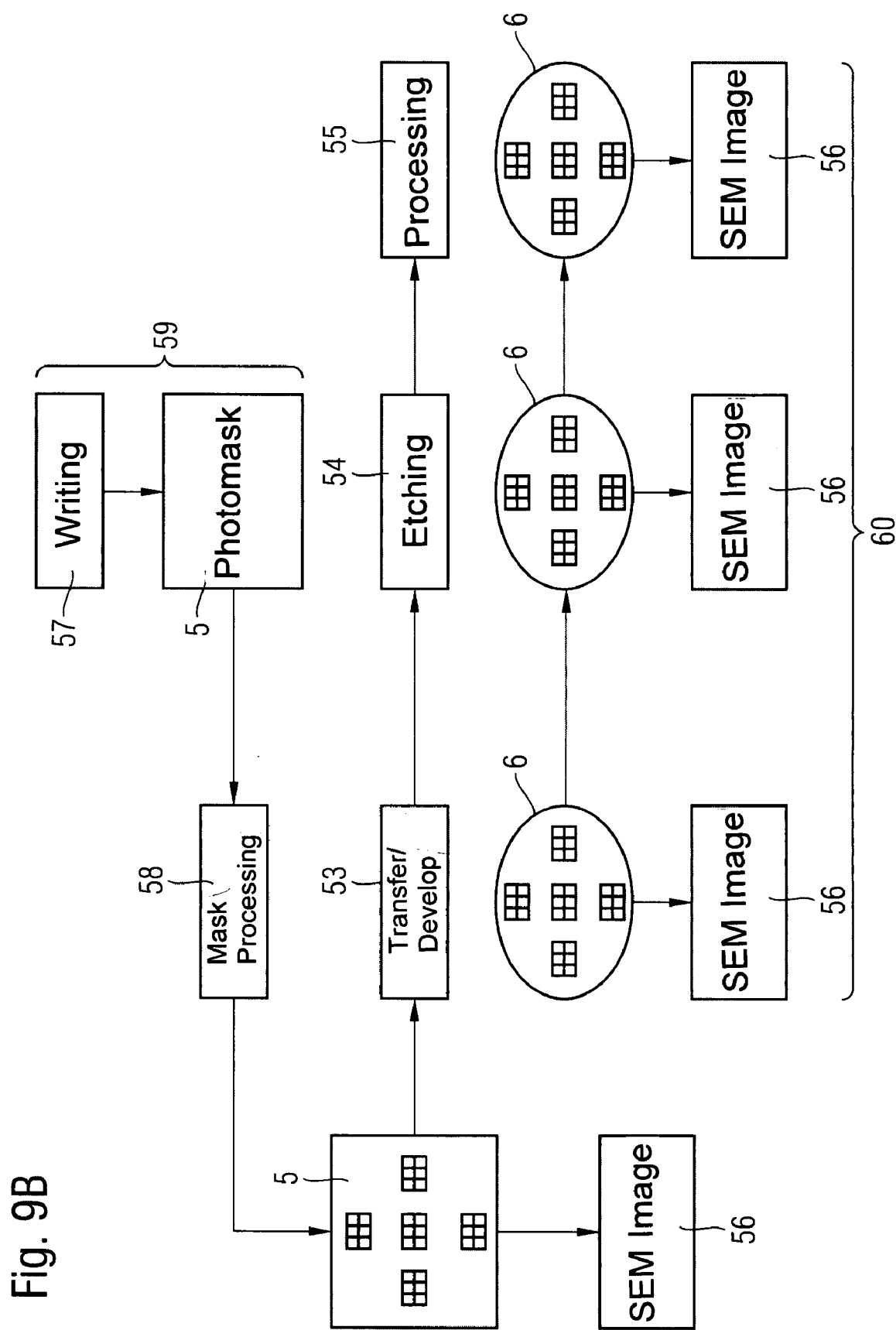
FIG. 9B is a block diagram illustrating steps of a wafer processing method according to the invention.

FIG. 9B schematically illustrates steps of an exemplary mask manufacturing sequence 59 and of an exemplary wafer processing sequence 60 as well as the steps after which an image of the transferred pattern can be taken and evaluated according to the method of the present invention. As is shown in FIG. 9B, first, a photomask 5 is formed for example, by writing a corresponding pattern into an appropriate resist material using an electron beam writer in a writing step 57. The pattern includes a test pattern or a set of test patterns as described above. Thereafter, one or more mask processing steps 58 are performed. An SEM image 56 can be taken from the photomask. The SEM image of the photomask after a specific mask processing step 58 can be evaluated by the method as will be described below.

After completing the photomask 5, the pattern including a test pattern or a set of test patterns as described above can be formed in a resist material that is applied on the surface of a substrate such as a silicon wafer 6, for example. In step 53, the pattern is transferred into the resist material by a common lithographic process and is developed. Thereafter, for example, a SEM image 56 of the developed resist pattern can be taken. Thereafter, an etching step 54 can, for example, be performed and thereafter, a further SEM image 56 can be taken. Optionally, further processing steps 55 such as an ion implantation step or others can be performed, after which a SEM image 56 is taken as well.

Accordingly, images, in particular, SEM images 56 can be taken in the course of the mask manufacturing sequence as well as of the wafer processing sequence. Moreover, a record of the aerial image 52 can be taken and evaluated as will be explained in the following text.

Figure 10:
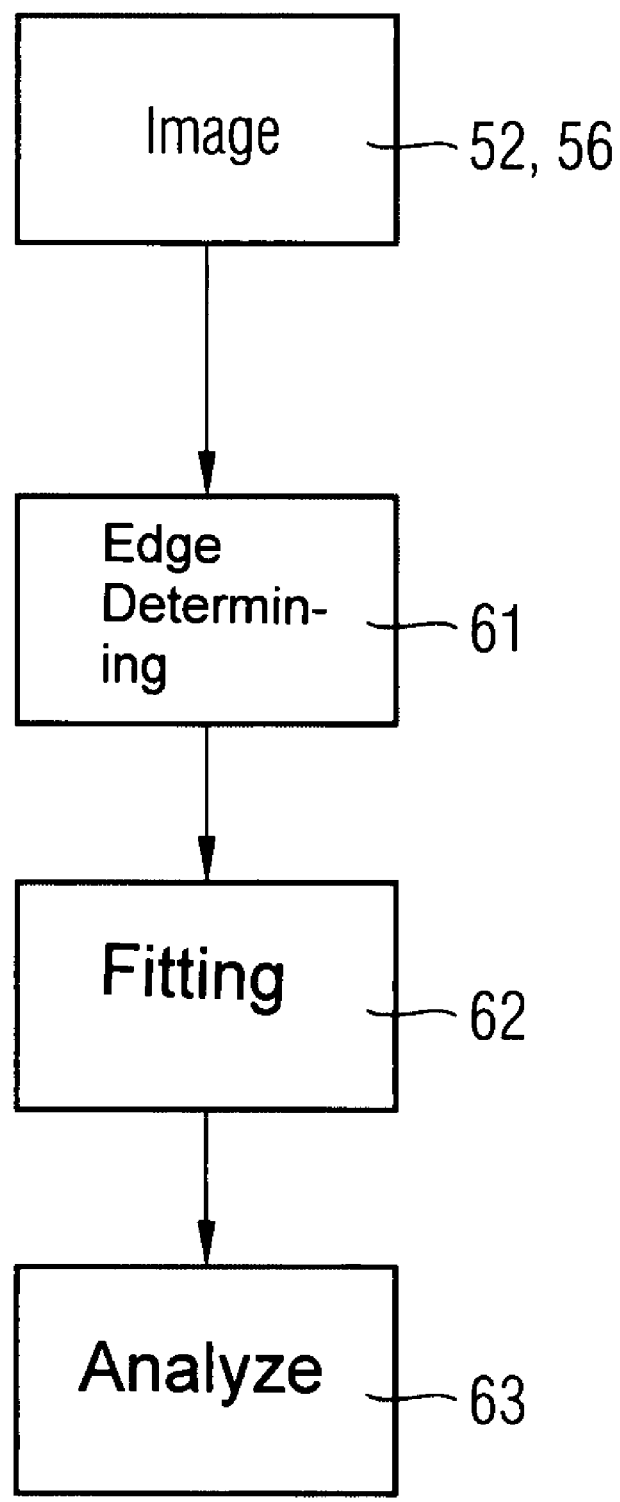
FIG. 10 is a flow chart illustrating steps for evaluating transfer properties of a test pattern according to the invention.

The evaluation of such an image will be described with reference to FIGS. 10 and 11. FIG. 10 shows a schematic diagram illustrating the sequence of process steps, whereas FIGS. 11A to 11D illustrate the results, which can be obtained after performing the process steps, respectively.

Figure 11A:
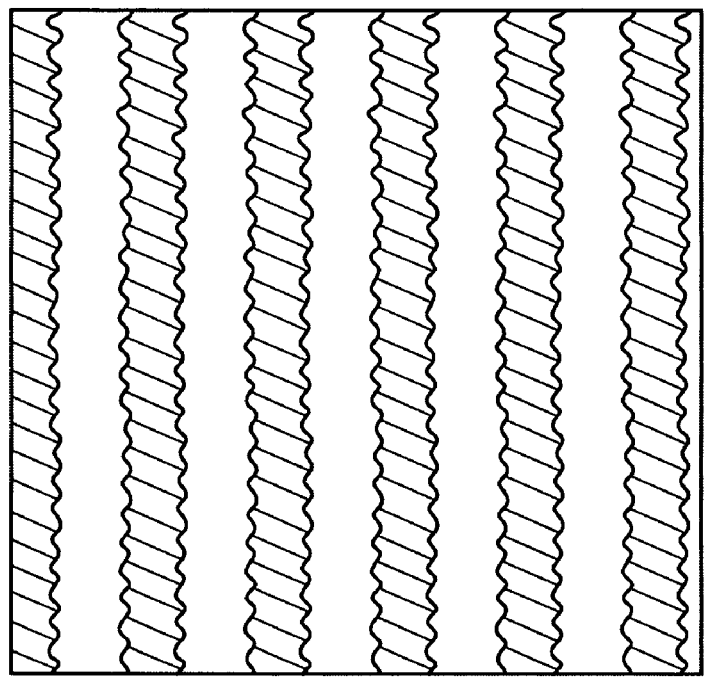
FIG. 11A is a diagrammatic, fragmentary, enlarged portion of an image to be analyzed by the method according to the invention.

FIG. 10 shows an exemplary sequence of process steps for evaluating a transferred pattern. Starting from an image of the transferred pattern that can be a record of the aerial image or a SEM image 56, an edge determination step 61 is performed. For example, FIG. 11A shows an image, which is to be analyzed by the process steps described. In particular the image shown in FIG. 11A can be a SEM image of a resist pattern.

Figure 11B:
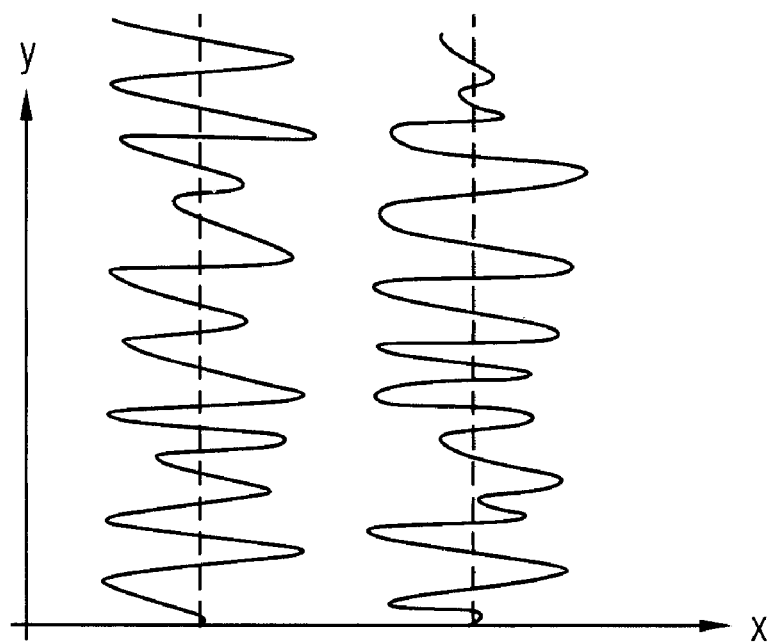
FIG. 11B is a graph illustrating an exemplary result of an edge determination of the method according to the invention.

The edge determination step is advantageously implemented as an edge detection algorithm over the matrix of gray levels. FIG. 11B shows an exemplary result of this edge determination step.

Figure 11C:
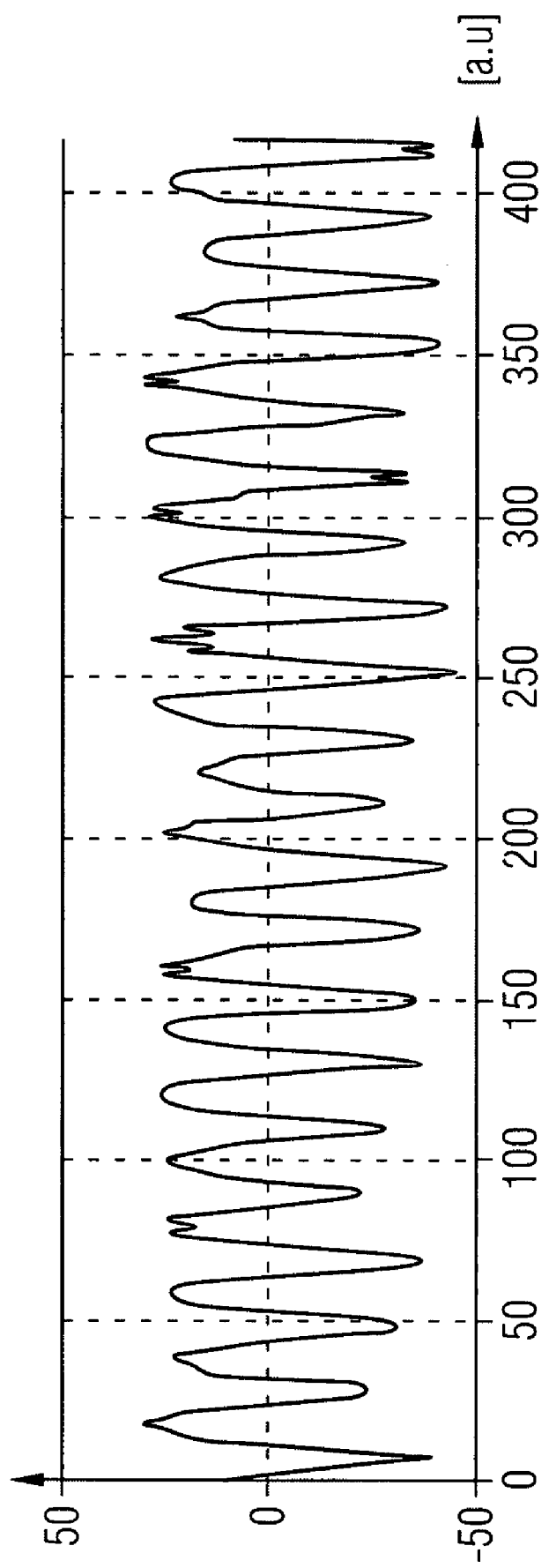
FIG. 11C is a graph illustrating an exemplary result of a fitting step of the method according to the invention.

Thereafter, as is shown in FIG. 10, a fitting step 62 is performed so that the edge position data are fitted to a straight line and the edge position residual is determined. Thereby, the zero line of the transferred periodic structure is obtained. FIG. 11C shows an exemplary output of the fitting step 62.

In the next step, the residual data of the lines are fed into a fast Fourier transformation device and the spectrum of amplitudes is obtained. In particular, the values illustrated in FIG. 11C are analyzed using a Fourier transform algorithm 63, whereby the spectrum A(f) shown in FIG. 11D is obtained.

Figure 11D:
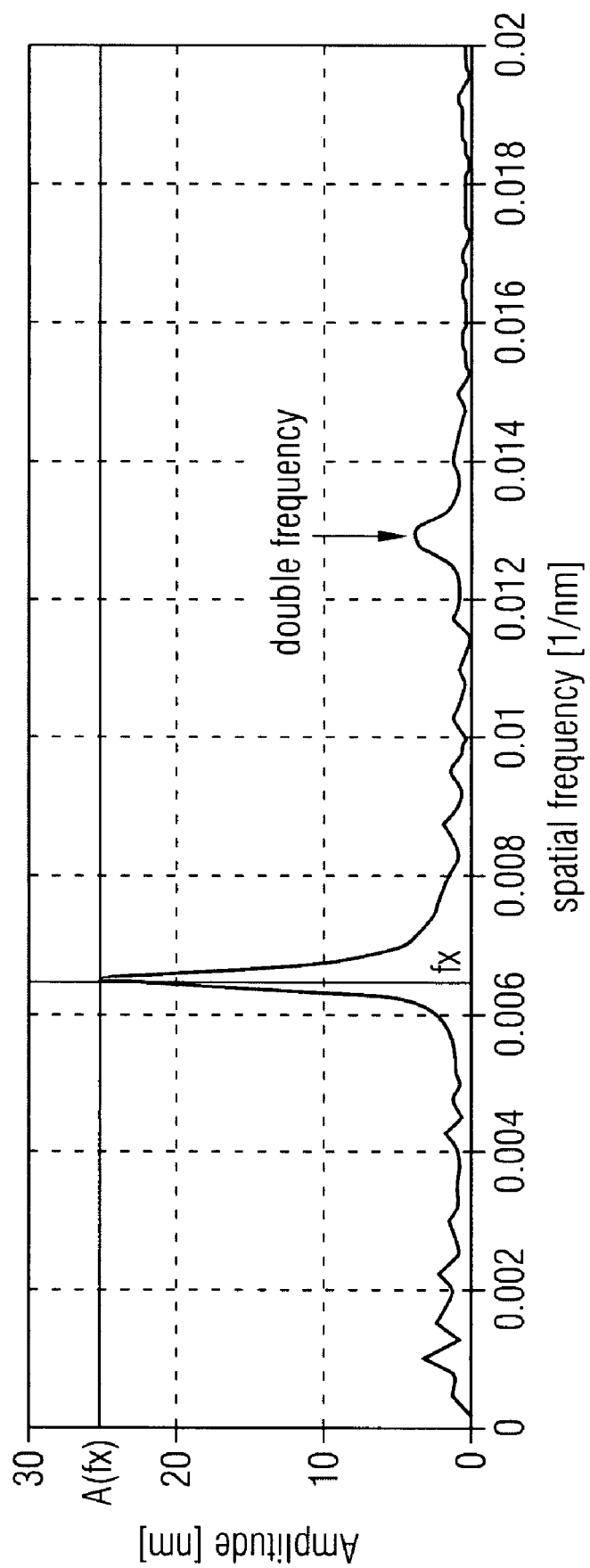
FIG. 11D is a graph illustrating an output result of the evaluating analysis of the method according to the invention.

As is shown in FIG. 11D, as a result of the evaluating method, the relationship of the amplitude in dependence from the spatial frequency A(f) is obtained. As can be seen from FIG. 1D, the spectrum shown in FIG. 11C substantially has one spatial frequency fx corresponding to the inverse of the fixed spatial period of the specific test pattern used.

The value of A(fx, image) is taken and it will be compared with a reference value A(fx, mask) of the test pattern forming part of the photomask 5. The reference value can, for example, be obtained by using the design data of the test pattern. Alternatively, the reference value can be obtained by evaluating an SEM image of the photomask 5 using the method, which has been described with reference to FIGS. 10 and 11. As a further alternative, the aerial image 51 of the photomask can be evaluated. As a result, the value A(fx, mask) is obtained.

In a next step, the ratio of A(fx, image) and A(fx, mask) can be determined resulting in the line edge roughness transfer function for the process under consideration and the specific spatial frequency fx. Likewise, the ratio of A(fx, image) and A(fx, mask) is determined for the other fixed spatial periods 1/fx of the other test patterns included in the photomask. As a result, the line edge roughness transfer function (LTF (fx)) can be obtained for the aerial imaging process, the printing process, the etching process, or any other process that is to be investigated.

The present invention further refers to a method of determining the optimal process parameters of a certain processing step. According to this method, a photomask 5 including a configuration 16 of test patterns, for example, such as described above with respect to FIGS. 8A and 8B, is used for forming an aerial image or for defining a corresponding pattern on a substrate. For investigating the influence of the specific transfer process on the line edge roughness, the process under consideration is performed using varying process parameters. Moreover, the configuration 16 of test patterns includes a plurality of test patterns each having a different spatial period fx.

For example, if the process under consideration is the exposure step, several illumination conditions are used. In this case, a circular, an annular, a disar, and a quasar illumination condition can be implemented, resulting in a transferred pattern for each of the different illumination conditions. Thereafter, an image of the pattern, which is transferred into the resist material is taken. Then, the value A(fx, illumination condition) is determined for each of the different illumination conditions and a plurality of values of fx, and the line edge roughness transfer function LTF(fx, illumination conditions) is determined for a variety of values of fx and for each of the illumination conditions by calculating the ratio of A(fx,illumination condition, image) and A(fx, illumination condition, mask). Then, the specific illumination condition for which LTF is close to or smaller than 1 is selected, thus determining the optimal illumination conditions for the specific process. With such a selection, a process is chosen that minimizes the transfer of roughness for a predetermined spatial period 1/fx.

Instead of the image of the pattern in the resist material, an aerial image 51 can be recorded under each of the illumination conditions and evaluated to determine the optimal illumination conditions.

In a similar manner as has been described above, process parameters for any other processing step can be determined using the method as described above. Examples of these processing steps include the development step, an etching step, or any other suitable processing step.

Generally, the line edge roughness transfer function is determined dependent upon the spatial frequency fx (LTF (fx)). In a range of fx in which LTF(fx) is smaller than 1, the line edge roughness transfer is suppressed. In a range of fx in which LTF(fx) is larger than 1, the line edge roughness transfer is enhanced. By choosing appropriate process conditions, the line edge roughness transfer function can be reduced. In addition, dependent upon the line edge transfer function, it is possible to determine, whether a specific photomask fulfills the required line edge roughness transfer properties or not.

We claim:

1. A method for evaluating the transfer properties of a test pattern, which comprises:
   providing a photomask with a test pattern having:
      lines having a line width and two lateral sides extending along a reference direction; and
      periodic structures directly adjacent and connected with the lines;
   transferring the test pattern to, thereby, obtain an image of the test pattern;
   determining edges of the image of the test pattern and obtaining therefrom a set of edge position data;
   fitting the edge position data to a straight line and determining edge position residuals;
   calculating an amplitude spectrum dependent upon spatial frequencies to, thereby obtain a relationship A(f,image) representing the amplitude in dependence of the spatial frequency;
   determining a maximum A(fx,image) of the relationship A(f,image);
   determining a maximum A(fx,photomask) of a reference amplitude spectrum; and
   forming a ratio of the maximum A(fx,image) of the image of the test pattern and the maximum A(fx,photomask).

2. The method according to claim 1, which further comprises:
   forming the lines and the periodic structures of a mask forming material; and
   forming the periodic structures to:
      project from the lines such that each of the periodic structures has:
         a maximum at which a distance from an outer edge of the structure to the line is largest; and
         an amplitude A that is a difference between the maximum and a minimum distance between an outer edge of the periodic structure and one of the lines, the difference being measured perpendicularly with respect to the reference direction, the amplitude A of all of the periodic structures being substantially equal;
   have a fixed period 1/f;
   define spaces adjacent to the lines including the periodic structures so that on either side of each of the lines are disposed two spaces, respectively, and vice-versa, the spaces having a spaces width measured perpendicularly with respect to the reference direction, the spaces width corresponding to a distance between two adjacent lines; and
   define an effective line width CD of the test pattern according to the formula:

$$CD \times l = B,$$

where: l corresponds to the length of the line in the reference direction and B corresponds to the area of a specific line including the periodic structures.

3. The method according to claim 1, which further comprises forming the periodic structures on either of the lateral sides of the lines with an amplitude and a period of the structures of both of the lateral sides being substantially equal.

4. The method according to claim 3, which further comprises forming a maxima of the periodic structure on a first of the lateral sides at the same height as corresponding maxima of a second of the lateral sides, the height being measured along the reference direction.

5. The method according to claim 3, which further comprises forming a maxima of the periodic structures on a first of the lateral sides at a position shifted by half a period with respect to a height of corresponding maxima of the periodic structures on a second of the lateral sides, the height being measured along the reference direction.

6. The method according to claim 1, wherein:
   the lines define spaces therebetween having a spaces width; and
   the line width is approximately equal to the spaces width.

7. The method according to claim 1, wherein:
   the lines define spaces therebetween having a spaces width; and
   the line width is larger than the spaces width.

8. The method according to claim 1, wherein:
   the lines define spaces therebetween having a spaces width; and
   the line width is smaller than the spaces width.

9. The method according to claim 1, wherein the periodic structures have an amplitude A in a range of between approximately 20 nm and approximately 220 nm.

10. The method according to claim 8, wherein the periodic structures have an amplitude A in a range of between approximately 80 nm and approximately 150 nm.

11. The method according to claim 1, wherein the periodic structures have a fixed period 1/f less than approximately 4000 nm.

12. The method according to claim 1, wherein the lines and the periodic structures define an effective line width less than approximately 360 nm.

13. The method according to claim 1, which further comprises carrying out the maximum A(fx,photomask) determining step by obtaining the maximum A(fx,photomask) of the reference amplitude spectrum by evaluating design data of the photomask.

14. The method according to claim 1, which further comprises carrying out the maximum A(fx,photomask) determining step by obtaining the maximum A(fx,photomask) of the reference amplitude spectrum by:
   taking an image of the photomask;
   determining edges of the image of the photomask and obtaining therefrom a set of photomask edge position data;
   fitting the photomask edge position data to a straight line and determining photomask edge position residuals;
   calculating the amplitude spectrum dependent upon spatial frequencies to, thereby, obtain a relationship A(f, photomask) representing the amplitude dependent upon the spatial frequency; and
   determining a maximum A(fx,photomask) of the relationship A(f,photomask).

15. A method for determining at least one parameter of a transfer process, which comprises:
   providing a photomask Including a plurality of test patterns, each of the plurality of test patterns comprising:
      lines having a line width and two lateral sides extending along a reference direction; and
      periodic structures directly adjacent and connected with the lines;
   each of the plurality of test patterns having a different fixed period 1/f selected from a predetermined range of f;
   performing a transfer process using a group of process parameters to obtain a set of transferred patterns corresponding to each of the group of process parameters;
   providing a set of images of the set of transferred patterns;
   evaluating the set of images of the transferred patterns by:
      determining edges of the image of the transferred pattern and obtaining therefrom a set of edge position data;
      fitting the edge position data to a straight line and determining the edge position residuals;
      calculating an amplitude spectrum dependent upon spatial frequencies to, thereby, obtain a relationship A(f, image) representing the amplitude dependent upon the spatial frequency;
      determining a maximum A(fx,image) of the relationship A(f,image); and
      determining a maximum A(fx,photomask) of a reference amplitude spectrum;
   forming a ratio of the maximum A(fx,image) of the image of the test pattern and the maximum A(fx,photomask); and
   selecting a process parameter so that the ratio of A(fx, photomask)/A(fx, image) is minimal in the predetermined range of fx.

16. The method according to claim 15, which further comprises:
   forming the lines and the periodic structures of a mask forming material; and
   forming the periodic structures to:
      project from the lines such that each of the periodic structures has:
         a maximum at which a distance from an outer edge of the structure to the line is largest; and
         an amplitude A that is a difference between the maximum and a minimum distance between the outer edge of the periodic structure and one of the lines, the difference being measured perpendicularly with respect to the reference direction, the amplitude A of all of the periodic structures being substantially equal;
   have a fixed period 1/f;
   define spaces adjacent to the lines including the periodic structures so that on either side of each of the lines are disposed two spaces, respectively, and vice-versa, the spaces having a spaces width measured perpendicularly with respect to the reference direction, the spaces width corresponding to a distance between two adjacent lines; and
   define an effective line width CD of the test pattern according to the formula:

$CD \times l = B,$ where: l corresponds to the length of the line in the reference direction and B corresponds to the area of a specific line including the periodic structures.

17. A method for evaluating the transfer properties of a test pattern, which comprises:
   providing a photomask with a test pattern having:
      lines having a line width and two lateral sides extending along a reference direction; and
      periodic structures directly adjacent and connected with the lines;
   forming the periodic structures to:
      project from the lines such that each of the periodic structures has:
         a maximum at which a distance from an outer edge of the structure to the line is largest; and
         an amplitude A that is a difference between the maximum and a minimum distance between an outer edge of the periodic structure and one of the lines, the difference being measured perpendicularly with respect to the reference direction, the amplitude A of all of the periodic structures being substantially equal;
      have a fixed period 1/f;
      define spaces adjacent to the lines Including the periodic structures so that on either side of each of the lines are disposed two spaces, respectively, and vice-versa, the spaces having a spaces width measured perpendicularly with respect to the reference direction,.the spaces width corresponding to a distance between two adjacent lines; and
   define an effective line width CD of the test pattern according to the formula:

$CD \times l = B,$ where: l corresponds to the length of the line in the reference direction and B corresponds to the area of a specific line including the periodic structures;
   forming the lines and the periodic structures of a mask forming material;
   transferring the test pattern to, thereby, obtain an image of the test pattern;
   determining edges of the image of the test pattern and obtaining therefrom a set of edge position data;
   fitting the edge position data to a straight line and determining edge position residuals;
   calculating an amplitude spectrum dependent upon spatial frequencies to, thereby obtain a relationship A(f,image) representing the amplitude in dependence of the spatial frequency;

determining a maximum $A(fx,image)$ of the relationship $A(f,image)$;
determining a maximum $A(fx,photomask)$ of a reference amplitude spectrum; and forming a ratio of the maximum $A(fx,image)$ of the image of the test pattern and the maximum $A(fx,photomask)$.

* * * * *